US010979154B1

(12) United States Patent
Pawar (10) Patent No.: US 10,979,154 B1
(45) Date of Patent: Apr. 13, 2021

(54) PERFORMING DIFFERENT RADIO FREQUENCY (RF) TESTS BY USING COMMON PORTS OF AN RF TESTING CHAMBER

(71) Applicant: T-Mobile USA, Inc., Bellevue, WA (US)

(72) Inventor: Swapnil Jijaba Pawar, Bellevue, WA (US)

(73) Assignee: T-Mobile USA, Inc., Bellevue, WA (US)

(*) Notice: Subject to any disclaimer, the term of this patent is extended or adjusted under 35 U.S.C. 154(b) by 0 days.

(21) Appl. No.: 16/730,715

(22) Filed: Dec. 30, 2019

(51) Int. Cl.
*H04B 17/00* (2015.01)
*H04B 17/16* (2015.01)
*H04B 17/29* (2015.01)
*G01R 29/10* (2006.01)

(52) U.S. Cl.
CPC ......... *H04B 17/16* (2015.01); *H04B 17/0085* (2013.01); *H04B 17/29* (2015.01); *G01R 29/105* (2013.01)

(58) Field of Classification Search
CPC ...... H04B 17/102; H04B 17/16; H04B 17/27; H04B 17/29; H04B 17/345; H04B 17/0085
See application file for complete search history.

(56) References Cited

U.S. PATENT DOCUMENTS

| | | | |
|---|---|---|---|
| 5,945,835 A | 8/1999 | McDonough et al. | |
| 6,943,561 B2 | 9/2005 | Verspecht | |
| 7,555,293 B2 | 6/2009 | Qi et al. | |
| 7,596,465 B2 | 9/2009 | Ristau et al. | |
| 7,756,230 B2 | 7/2010 | Raphaeli et al. | |
| 8,019,307 B2 | 9/2011 | Chen | |
| 8,112,043 B2 | 2/2012 | Knudsen et al. | |
| 8,295,777 B1 | 10/2012 | Yenney et al. | |
| 8,615,263 B2 | 12/2013 | Madon et al. | |
| 8,774,729 B2 | 7/2014 | Olgaard et al. | |
| 8,811,461 B1 | 8/2014 | Huynh | |
| 8,934,849 B2 | 1/2015 | Karnakaris | |
| 8,995,926 B2 | 3/2015 | Mow et al. | |
| 9,002,290 B2 | 4/2015 | Olgaard | |
| 9,154,241 B2 | 10/2015 | Luong et al. | |
| 9,167,459 B2 | 10/2015 | Olgaard | |
| 9,246,606 B2 | 1/2016 | Olgaard | |
| 9,338,664 B2 | 5/2016 | Tenbroek et al. | |
| 9,599,657 B2 | 3/2017 | Ding et al. | |

(Continued)

*Primary Examiner* — Tuan Pham (74) *Attorney, Agent, or Firm* — Perkins Coie LLP (57) ABSTRACT

A radio frequency (RF) testing chamber enabled to perform different RF tests using the same ports of the RF testing chamber without reconfiguring port connections to perform the multiple tests. For example, a testing system can determine a total number of RF bands required to perform the different RF tests and combine the total number of RF bands into multiple groups of RF bands. In some instances, each RF band of any group is distinct from any other RF band of any other group, each group only includes a combination of RF bands that are non-interfering among the group, and a total number of the multiple groups is less than or equal to a total number of ports. The testing system can perform the different RF tests without needing to disconnect a source of any of the RF bands that feeds the port of the RF testing chamber.

20 Claims, 8 Drawing Sheets

(56) References Cited

U.S. PATENT DOCUMENTS

| | | | |
|---|---|---|---|
| 9,692,528 | B2 | 6/2017 | Wang et al. |
| 9,774,406 | B2 | 9/2017 | Huynh |
| 9,794,009 | B1 | 10/2017 | Olgaard et al. |
| 9,983,258 | B2 | 5/2018 | Zhang |
| 10,009,126 | B2 | 6/2018 | Olgaard et al. |
| 10,057,795 | B2 | 8/2018 | Starzer et al. |
| 10,110,326 | B1 * | 10/2018 | Kyrolainen ............ H04B 17/29 |
| 10,110,336 | B2 | 10/2018 | Kucheravy |
| 2011/0263215 | A1 * | 10/2011 | Asplund ............ H04B 17/3912 |
| | | | 455/115.1 |
| 2016/0212641 | A1 * | 7/2016 | Kong ................. H04B 17/0087 |
| 2016/0359718 | A1 | 12/2016 | Banerjee et al. |
| 2019/0036633 | A1 | 1/2019 | Kucheravy |
| 2019/0124529 | A1 | 4/2019 | García et al. |
| 2019/0159044 | A1 | 5/2019 | Abou-rizk et al. |

* cited by examiner

| PORT | PIPE | PCI | BAND | PIPE | PCI | BAND | EARFCN | PIPE | PCI | BAND | EARFCN |
|---|---|---|---|---|---|---|---|---|---|---|---|
| 1 | 1 | 421 | Freq 1 | 1 | 254 | Freq 2 | 1050 | | | | |
| 2 | 2 | 421 | Freq 1 | 2 | 254 | Freq 2 | 1050 | | | | |
| 3 | 1 | 427 | Freq 2 | 1 | 252 | Freq 1 | 2300 | | | | |
| 4 | 2 | 427 | Freq 2 | 2 | 252 | Freq 1 | 2300 | | | | |
| 5 | 1 | 251 | Freq 1 | 1 | 427 | Freq 2 | 1050 | | | B71/Freq 3 | |
| 6 | 3 | 251 | Freq 1 | 2 | 427 | Freq 2 | 1050 | | | B71/Freq 3 | |
| 7 | 1 | 424 | Freq 3 | 1 | 422 | Freq 1 | 2300 | | | | |
| 8 | 2 | 424 | Freq 3 | 2 | 422 | Freq 1 | 2300 | | | | |
| 9 | 1 | 255 | Freq 2 | 1 | 253 | Freq 1 | 2300 | | | | |
| 10 | 1 | 255 | Freq 2 | 2 | 253 | Freq 1 | 2300 | | | | |
| 11 | | For legacy or future use | | | | | | | | | |
| 12 | | For legacy or future use | | | | | | | | | |
| 13 | 3 | 421/211 | Freq 1 | 3 | 427 | Freq 2 | 1050 | | | | |
| 14 | 4 | 421/211 | Freq 1 | 4 | 427 | Freq 2 | 1050 | | | | |
| 15 | 3 | 427 | Freq 2 | | | | | | | | |
| 16 | 4 | 427 | Freq 2 | | | | | | | | |
| 17 | 2 | 251 | Freq 1 | | | | | | | B71/Freq 3 | |
| 18 | 4 | 251 | Freq 1 | 3G | 3G | | | | | B71/Freq 3 | |
| 19 | 3 | 424 | Freq 3 | 3 | 422 | Freq 1 | 2300 | | | | |
| 20 | 4 | 424 | Freq 3 | 4 | 422 | Freq 1 | 2300 | | | | |
| 21 | 3 | 256 | Freq 2 | 3 | 252 | Freq 1 | 2300 | | | Freq 11 | |
| 22 | 3 | 256 | Freq 2 | 4 | 252 | Freq 1 | 2300 | | | Freq 11 | |
| 23 | 5 | 257 | Freq 2 | 3 | 253 | Freq 1 | 2300 | | | Freq 11 | |
| 24 | 5 | 257 | Freq 2 | 4 | 253 | Freq 1 | 2300 | | | Freq 11 | |
| 25 | 3 | 254 | Freq 2 | | | | | | | | |
| 26 | 4 | 254 | Freq 2 | | | | | | | | |
| 27 | 1 | 423 | Freq 1 | 1 | 425 | Freq 3 | 5060 | | | | |
| 28 | 2 | 423 | Freq 1 | 2 | 425 | Freq 3 | 5060 | | | | |
| 29 | 3 | 423 | Freq 1 | 3 | 425 | Freq 3 | 5060 | | | | |
| 30 | 4 | 423 | Freq 1 | 4 | 425 | Freq 3 | 5060 | | | | |
| 31 | 1 | 426 | Freq 3 | 1 | 429 | Freq 2 | 1050 | | | | |
| 32 | 2 | 426 | Freq 3 | 2 | 429 | Freq 2 | 1050 | | | | |

PERFORMING DIFFERENT RADIO FREQUENCY (RF) TESTS BY USING COMMON PORTS OF AN RF TESTING CHAMBER

BACKGROUND

More and more devices today have radio frequency (RF) wireless circuitry. Examples range from cellular phones or laptop computers to something as innocuous as a car key fob. Wireless devices communicate over open airways and their operation depends upon careful consideration and design of their operating frequency, power level, signaling format, and other technical issues. Since these devices are wireless, design and testing present challenges because of having signals propagating without any physical means of connection. Testing RF wireless communications is especially appropriate to characterizing the performance of a wireless device. However, accurate testing requires reducing or eliminating any noise or interfering signals that would result in erroneous test results.

Generally, RF isolation chambers (also known as Faraday cages or RF cages) provide a clean RF environment for RF testing. In some instances, an RF cage is quite large to enclose not only the device but the entire lab bench and all equipment, including a human operator. However, for the vast majority of RF tests, a benchtop RF shielded test enclosure is an adequate solution. Its small size, array of I/O connectors and RF isolation allows one to test a wireless device in a silent, clean RF environment, assuring that the signals being used and presented are for the device and nothing else.

Test signals are communicated into and out of a RF cage with ports that allow RF test signals to pass through. RF cages can have ports for other signals such as data lines, power lines, or control signals. In general, a port couples to a conductor passing through the RF wall and must be suitably filtered, or the shielding integrity of the enclosure is compromised. The selection of filters depends on variables such as data speed, power current requirements, frequency of device under test, as well as mechanical issues such as cable length, ports used and desired placement. Any wireless device typically undergoes numerous tests, which requires the burdensome and inefficient tasks of disconnecting and reconnecting different combinations of conductors to a limited number of ports.

BRIEF DESCRIPTION OF THE DRAWINGS

Embodiments of the present technology will be described and explained through the use of the accompanying drawings.

The drawings, some components and/or operations can be separated into different blocks or combined into a single block when discussing some embodiments of the present technology. Moreover, while the technology is amenable to various modifications and alternative forms, specific embodiments have been shown by way of example in the drawings and are described in detail below. The intention, however, is not to limit the technology to the particular embodiments described herein. On the contrary, the technology is intended to cover all modifications, equivalents, and alternatives falling within the scope of the technology as defined by the appended claims.

DETAILED DESCRIPTION

The disclosed embodiments improve over prior solutions by combining radio frequency (RF) bands to perform different RF tests using a limited number of ports of an RF testing chamber ("RF chamber"). In particular, an RF chamber can protect sensitive electronic equipment from RF interference, often during wireless device testing. An RF chamber has a limited number of ports that can each communicate one RF signal for testing the device. To perform different tests, a user must manually disconnect transmit/receive (Tx/Rx) pipes from the ports and connect other Tx/Rx pipes ("pipes") to perform other tests. Hence, testing is physically burdensome and time-consuming.

The disclosed embodiments include a system for utilizing an RF chamber to perform numerous RF tests by using a common and limited number of ports. The system eliminates the need to manually disconnect pipes and connect other pipes for other tests. In one example, multiple RF sources for different RF tests feed into a combiner device, which combines non-interfering RF bands into groups. The combiner feeds the groups of non-interfering RF bands to the fixed number of ports of the RF testing chamber. For example, various 2G/3G/4G/5G/E911 sources of different RF bands can be fed to a combiner device that groups different non-interfering RF bands for simultaneous RF testing in the RF testing chamber. The groups of non-interfering RF bands that feed the RF testing chamber can be determined manually or algorithmically based on the number of RF sources, the RF bands of the sources, the number of ports, etc. Then, all the sources of RF bands are connected and can remain connected throughout all tests. Thus, quick in/out testing with static assigned ports can handle multiple RF bands, which eliminates the hassle of connecting and disconnecting RF sources for different tests, or the need for more ports.

Various embodiments of the disclosed systems and methods are described. The following description provides specific details for a thorough understanding and an enabling description of these embodiments. One skilled in the art will understand, however, that the invention can be practiced without many of these details. Additionally, some well-known structures or functions may not be shown or described in detail for the sake of brevity. The terminology used in the description presented below is intended to be interpreted in its broadest reasonable manner, even though it is being used in conjunction with a detailed description of certain specific embodiments of the invention.

Although not required, embodiments are described below in the general context of computer-executable instructions, such as routines executed by a general-purpose data processing device, e.g., a networked server computer, mobile device, or personal computer. Those skilled in the relevant art will appreciate that the invention can be practiced with other communications, data processing, or computer system configurations, including: Internet appliances, handheld devices, wearable computers, all manner of cellular or mobile phones, multi-processor systems, microprocessor-based or programmable consumer electronics, set-top boxes, network PCs, mini-computers, mainframe computers, media players and the like. Indeed, the terms "computer," "server," and the like are generally used interchangeably herein, and refer to any of the above devices and systems, as well as any data processor.

While aspects of the disclosed embodiments, such as certain functions, can be performed exclusively or primarily on a single device, some embodiments can also be practiced in distributed environments where functions or modules are shared among disparate processing devices, which are linked through a communications network, such as a local area network (LAN), wide area network (WAN), or the Internet. In a distributed computing environment, program modules can be located in both local and remote memory storage devices.

Aspects of the invention can be stored or distributed on tangible computer-readable media, including magnetically or optically readable computer discs, hardwired or preprogrammed chips (e.g., EEPROM semiconductor chips), nanotechnology memory, biological memory, or other data storage media. In some embodiments, computer implemented instructions, data structures, screen displays, and other data under aspects of the invention can be distributed over the Internet or over other networks (including wireless networks), on a propagated signal on a propagation medium (e.g., an electromagnetic wave(s), a sound wave) over a period of time, or they can be provided on any analog or digital network (packet switched, circuit switched, or other scheme).

Figure 1:
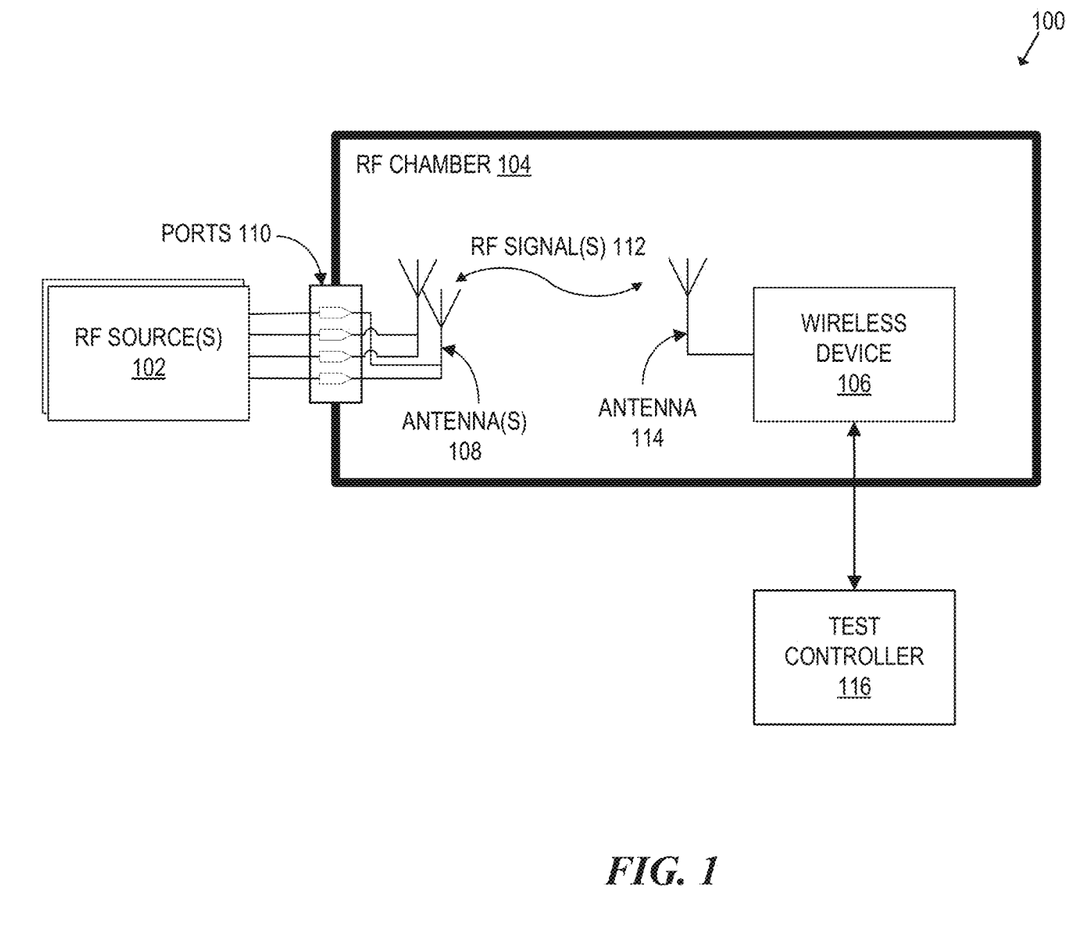
FIG. 1 is a block diagram that illustrates a radio frequency (RF) testing system with an enclosed RF environment.

FIG. 1 depicts a test system for RF testing of a wireless device. The test system 100 includes one or more RF sources 102 (e.g., base station emulators), an RF chamber 104 that provides an enclosed RF environment for a wireless device 106. For example, the wireless device 106 may be a handheld mobile device such as a smartphone or tablet computer. Other examples of the wireless device 106 is a laptop computer or any other electronic device that is capable of transmitting or receiving signals wirelessly.

The RF chamber 104 is an electromagnetic (EM) wave shield environment, such as an EM anechoic chamber (which may be a full or semi-anechoic chamber), a shield room, or an RF enclosure, etc. One or more antenna(s) 108 are positioned in the RF chamber 104 and are connected to the RF source(s) 102 through a number of ports 110 that penetrate the RF chamber 104. As shown, at least some of the ports 110 are connected to the RF source(s) 102 by, for example, a coaxial cable to simulate communications by one or more base stations in the RF chamber 104. An antenna 112 is positioned within the RF chamber 104 and connected to the wireless device 106 to communicate RF signals 112 with the RF source(s) 102 via the antennas 108. In some tests, the antenna 114 and the wireless device 106 are included in the same housing, but these components may be tested separately.

The RF signals 112 are communicated between the antenna(s) 108 of the RF source(s) 102 and the antenna 114 of the wireless device 106. A test controller 116 is connected to the wireless device 106 for controlling the performance of various test operations and measurements. While the RF source(s) 102 and wireless device 106 are illustrated as separate components, their functions may be performed by the same device. Alternately, the test controller 116 could be a computer or computing device separate from the RF source(s) 102, as will be appreciated by those skilled in the art.

The demand on telecommunications networks to accommodate more users and more devices per users continues to grow. In particular, there is a need for an increasing number of frequency bands for telecommunications networks. As the number of frequency bands increases, the requirements of physical RF points from a radio module such as a remote radio head (RRH) for a testing environment increases. In wireless system technologies such as GSM, CDMA, UMTS, or LTE, the radio equipment is remote to the BTS/NodeB/eNodeB or any other base station. The equipment is used to extend the coverage of a base station in challenging environments such as rural areas or tunnels. They are generally connected to the base station via a fiber optic cable using common public radio interface protocols.

Figure 2:
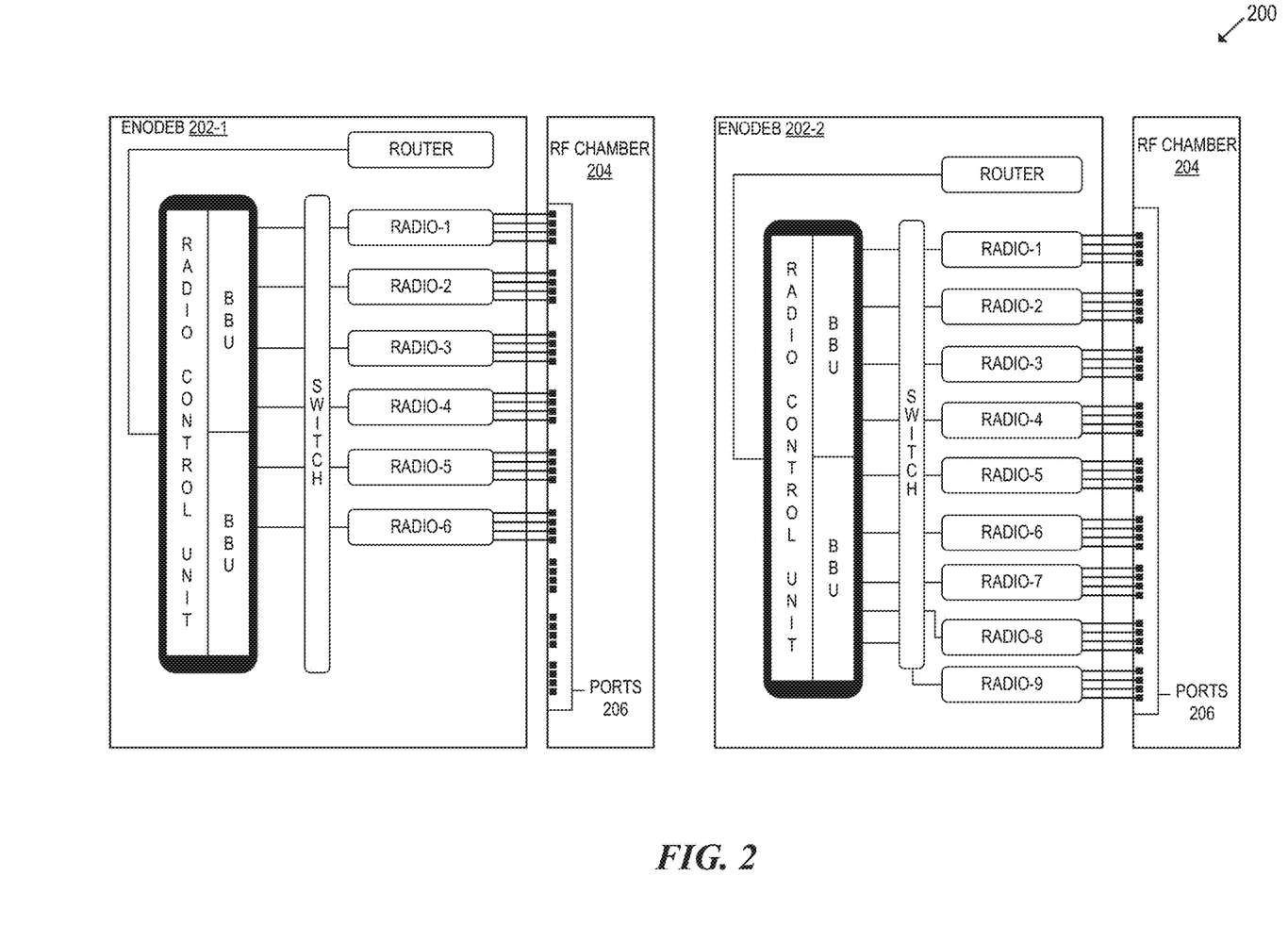
FIG. 2 illustrates examples of RF sources connected to an RF chamber for RF testing of a wireless device.

FIG. 2 illustrates examples of RF sources connected to an RF chamber for RF testing of a wireless device. As shown, the RF sources 200 include eNodeB 202-1 and eNodeB 202-2 emulators (collectively or individually referred to as "eNodeB 202"). Each eNodeB 202 includes radios that communicate RF signals through pipes to ports the RF chamber 204. Each radio can have any number of pipes (e.g., 2, 4). An equal number of available ports and pipes are required in a one-to-one mapping configuration to test all the RF signals without need to re-cable pipes. However, the illustrated RF chamber 204 only has 36 ports The eNodeB 202-1 has five radios. Each radio has four pipes that can each feed a distinct RF signal to the ports 206 of the RF chamber 204. As such, the RF chamber 204 can accommodate the 24 pipes of the eNodeB 202-1 while leaving some spare ports for future use. The eNodeB 202-2 includes radios that each have four pipes for communicating respective RF signals to ports of the RF chamber 204. The RF signals of the different radios are communicated one signal per port 206. Because RF signals at the same frequency can interfere with each other, connecting one signal per port 206 can avoid interference that would cause erroneous test results. As such, the eNodeB 202-2 requires 36 ports on the RF chamber to test the wireless device for that eNodeB 202-2. Hence, the RF chamber 204 can also accommodate the 36 pipes of the eNodeB 202-2.

Given the limited number of ports 206, a technician would need to connect the pipes of eNodeB 202-1 to perform a first test, then disconnect the pipes of eNodeB 202-1 to connect the pipes of eNodeB 202-2 to perform a second test. That is, RF testing based on eNodeB 202-1 and eNodeB 202-2 requires testing a total of 15 radios, which requires 60 ports (15 radios×4 pipes) of the RF chamber 204, which only has 36 ports. Thus, performing both tests requires connecting and disconnecting radios to different ports, which is burdensome and time-consuming. As such, a technician must test the eNodeB 202-1 and 202-2 separately. To do so, the technician must setup a first test by connecting each of the pipes from the radios of the eNodeB 202-1 to the ports 206 of the RF chamber 204. After the first test is complete, the technician must disconnect the pipes from the radios of the eNodeB 202-1 and connect the pipes from the radios of the eNodeB 202-2 to the ports 206 of the RF chamber 204.

Figure 3:
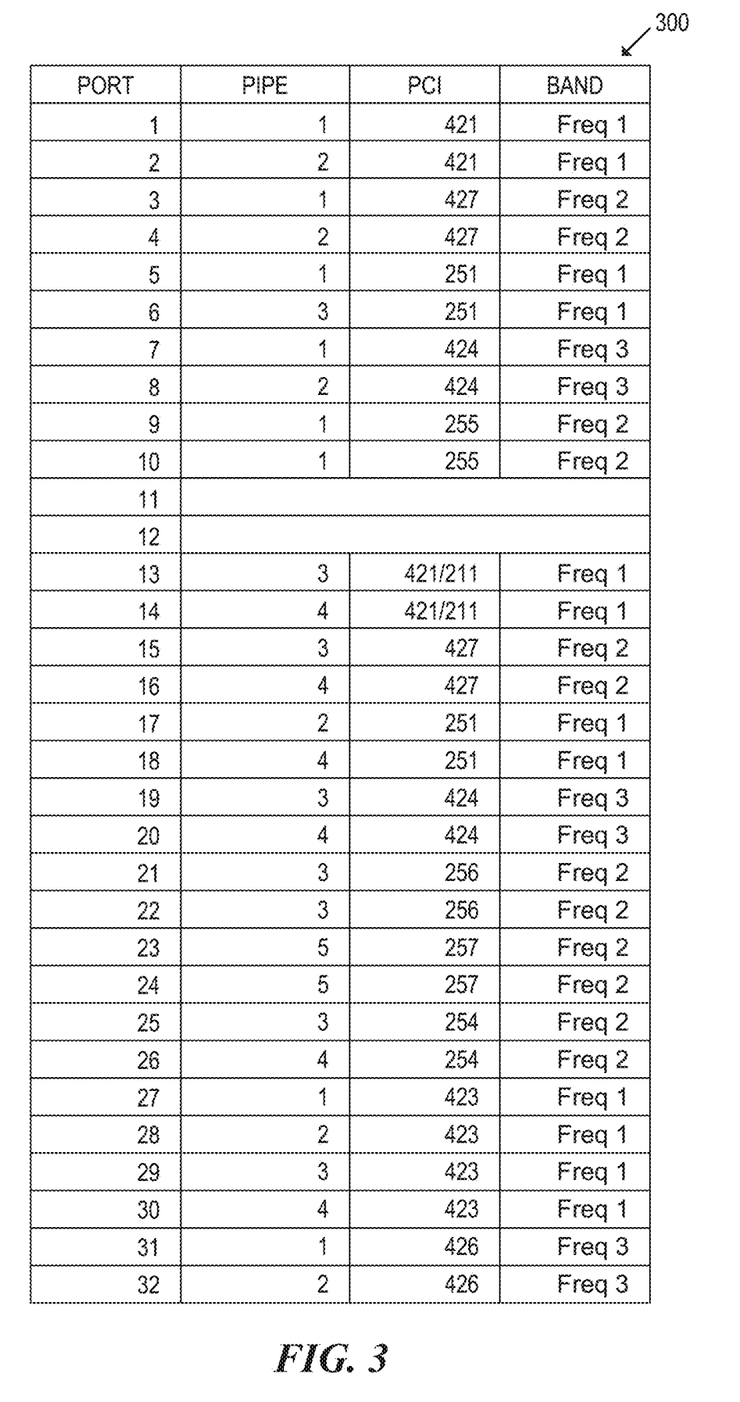
FIG. 3 is a table that maps RF sources to ports of an RF chamber in a one-to-one mapping configuration.

FIG. 3 is a table that maps RF sources to ports of an RF chamber in a one-to-one mapping configuration. As shown in the table 300, there are only 32 ports available for the RF chamber. Tx/Rx pipes can communicate RF signals to ports. The interfaces (e.g., peripheral component interconnects (PCIs)) communicate through the pipes. As such, a PCI can route distinct RF signals through the pipes to the ports of the RF chamber. Further, the RF signals are each associated with a frequency band (Freq 1, Freq 2, Freq 3, or Freq 4).

Specifically, ports 1, 2, 3, 4, and so on correspond to distinct physical ports, and each PCI has four pipes. For example, the PCI 421 has four pipes 1, 2, 3, and 4 at Freq 1 that are connected to ports 1, 2, 13, and 14, respectively, of the RF chamber. The PCI 427 has four pipes 1, 2, 3, and 4 at Freq 2 that are connected to ports 3, 4, 15, and 16, respectively, of the RF chamber. The PCI 251 has four pipes 1, 3, 2, and 4 at Freq 1 that are connected to ports 5, 6, 17, and 18, respectively, of the RF chamber, and so on. Again, there is only one band per radio that is connected to one port of the RF chamber. Assuming that each radio has four pipes and the RF chamber has only 32 ports, the maximum number of radios that can connect to the RF chamber is eight. As such, requiring any new radio to be connected to the test environment requires disconnecting pipes and connecting other pipes, which is burdensome and time consuming.

Figure 4:
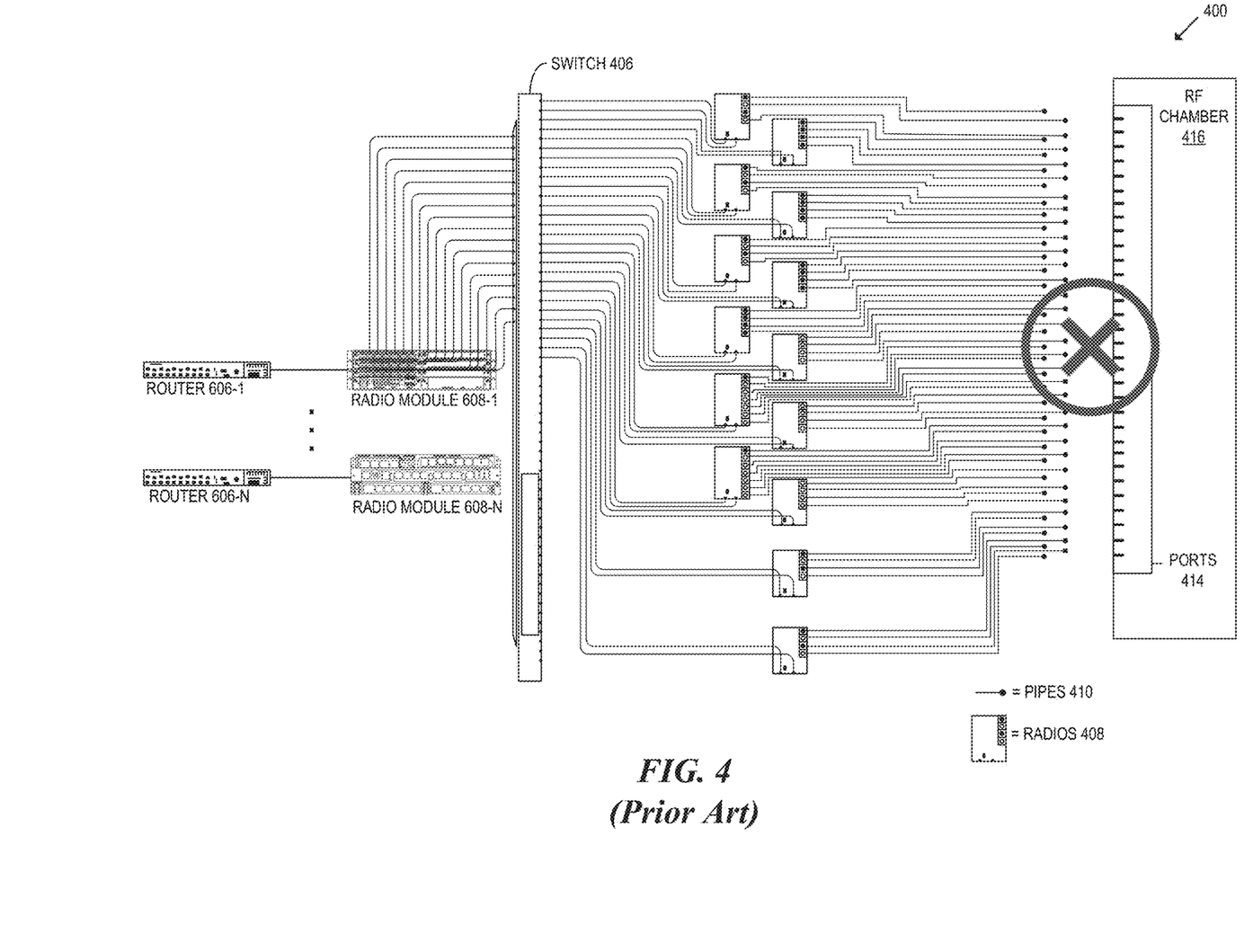
FIG. 4 is a diagram that illustrates a system that requires re-cabling RF sources to perform RF tests.

FIG. 4 is a diagram that illustrates a system that requires re-cabling of RF sources to perform RF tests, due to a number of RF signals that exceeds a number of available ports. As shown, the system 400 includes N back-end routers 402 coupled to N radio modules 404, which are sources of RF signals. In particular, the router 402-1 feeds the radio module 404-1, which outputs signals to the switch 406. The switch 406 feeds 14 different radios 408, which each output RF signals in four respective pipes 410. The pipes 410 require a matching number of ports 414. However, there are fewer number of ports 414 compared to the 56 pipes 410 such that testing all pipes 410 simultaneously is not possible. As such, one could not connect each RF signal separately from the pipes to the ports 614 of the RF chamber 616 to perform different RF tests because there are an insufficient number of ports available for each pipe in a one-to-one mapping configuration.

The disclosed embodiments overcome the drawbacks of the previous techniques that require one frequency band per port to minimize interference from other frequency bands. In some embodiments, combinations of radio signals are connected to the same ports of an RF chamber to enable performing multiple tests simultaneously. To avoid interference, the frequency bands that feed a particular port are selected to not interfere with each other and to minimize the impact that could result from combining different frequency bands to the same port.

Figure 5:
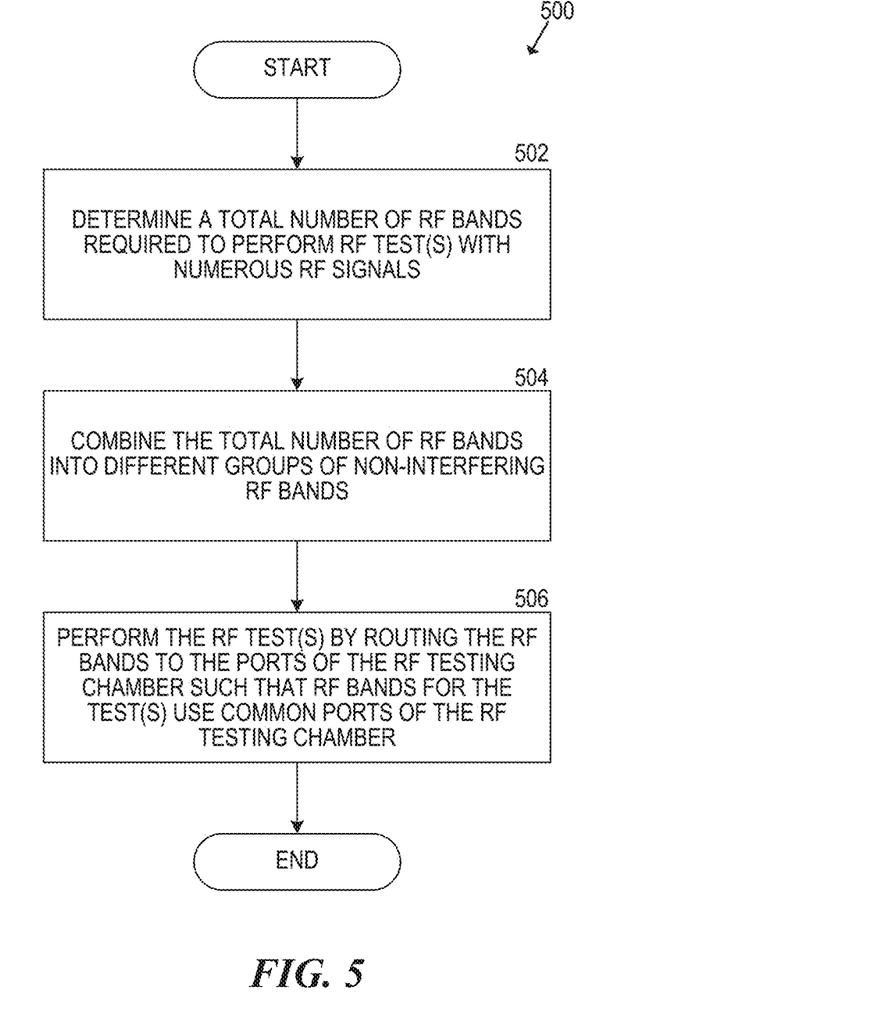
FIG. 5 is a flow diagram that illustrates a method for combining RF signals to perform different RF tests with a limited number of ports to an RF chamber.

FIG. 5 is a flow diagram that illustrates a method for combining RF signals to perform different RF tests with a limited number of ports to an RF chamber. Specifically, the method 500 enables performing different RF tests by using the same ports of the RF testing chamber without needing to reconfigure port connections to perform the different tests. The method 500 can be performed by a testing system that receives the RF signals for different RF tests and formulates combinations of the RF signals that feed a limited number of ports of the RF chamber.

Figure 6:
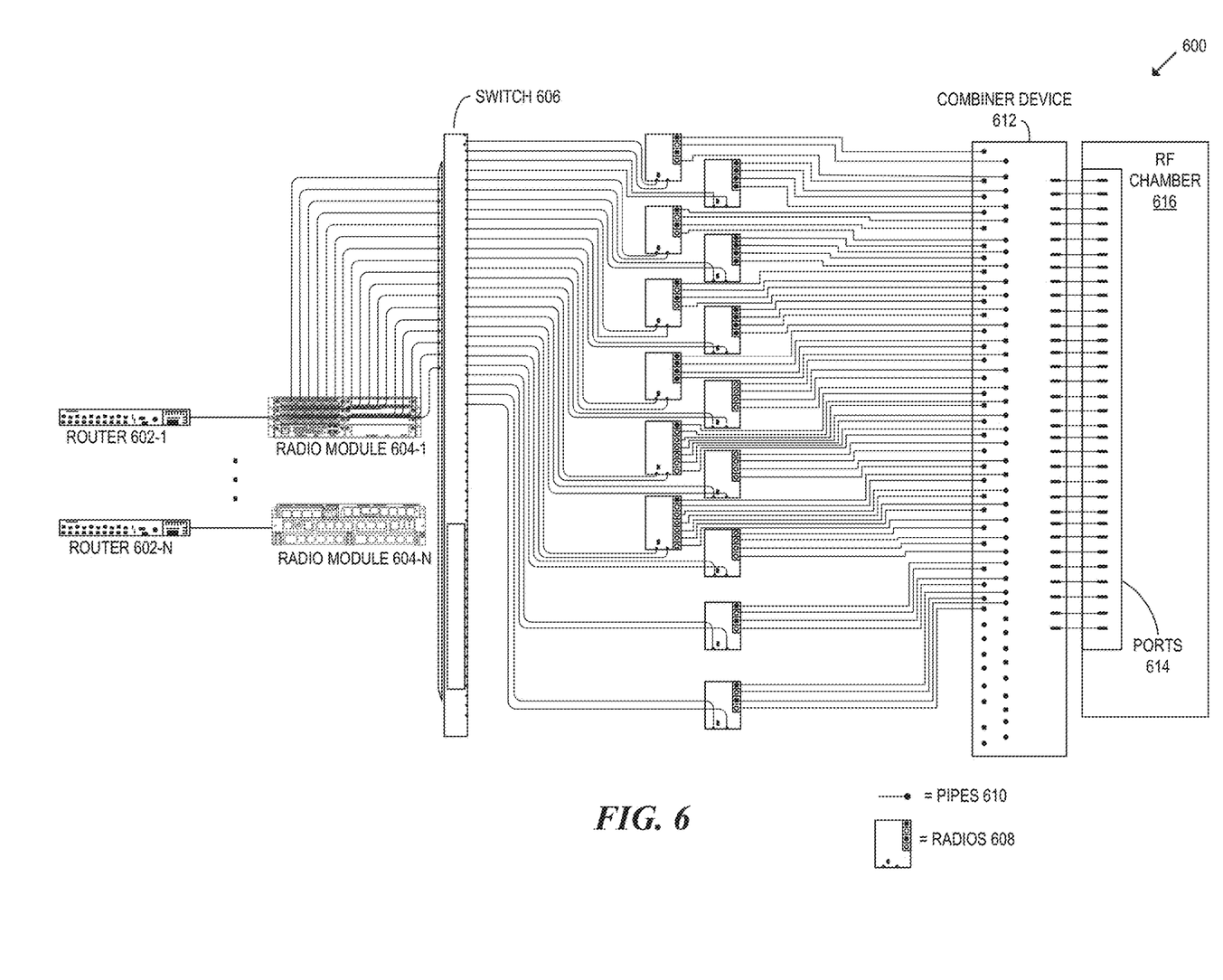
FIG. 6 is a diagram that illustrates a system that can perform RF tests by using ports of the RF chamber without needing to reconfigure connections for different tests.

For example, FIG. 6 is a diagram that illustrates a system 600 that can perform RF tests by using ports of the RF chamber without needing to reconfigure connections for different tests. As shown, the system 600 includes N back-end routers 602 coupled to N radio modules 604, which are sources of RF signals. In particular, the router 602-1 feeds the radio module 604-1, which outputs signals to the switch 606. The switch 606 feeds 14 different radios 608, which each output RF signals in four respective pipes. The output of the radios 608 require 56 ports, which are not available on RF chamber 616. In other words, one could not connect each RF signal separately from the pipes to the ports 614 of the RF chamber 616 to perform RF tests because there are an insufficient number of ports available for each pipe in a one-to-one mapping configuration. To overcome this drawback, the pipes 610 connect to ports of a combiner device 612, which combines the RF signals of the pipes to reduce the number of ports required by the RF chamber 616. That is, the combiner device 612 groups combinations of non-interfering RF signals to reduce the required number of ports for an RF chamber.

Referring back to FIG. 5, the RF chamber can subject a wireless device to RF signals that are more numerous than the number of ports used to feed the RF signals to the RF chamber. The testing system combines RF signals in such a way that the RF signals of a combination are non-interfering with each other. Likewise, RF signals that would interfere with each other are combined for routing to different ports of the RF chamber. The testing system analyze the number of RF signals, number of RF ports, and frequency bands of the RF signals to algorithmically produce combinations of non-interfering RF signals of different tests that are connected to the limited number of ports of the RF chamber.

In 502, the testing system can determine a total number of RF bands required to perform the different RF tests. The RF bands are distinct from each other. For example, the testing system can count the number of RF bands for each of one or more RF tests. The testing system can then sum the count of the RF bands for all RF tests to obtain a total number of RF bands. In one example, the total number of the ports of the RF chamber is less than a total number of ports required to perform one of the RF tests.

In 504, the testing system combines the total number of RF bands into different groups of RF bands. For example, the testing system can divide the total number of RF bands into a fewer number of groups of RF bands. The RF bands can be evenly or unevenly divided among the groups of RF bands. That is, the RF bands required by the different tests could interfere with each other if communicated in the same medium. As such, interfering RF signals would distort the RF tests. Specifically, an interference is that which modifies a RF signal in a disruptive manner, as it travels along a channel between its source and receiver. To avoid this drawback, each group only includes a combination of RF bands that are non-interfering among the group. More specifically, forming a group of RF signals requires evaluating the frequency bands of each signal to determine whether they would interfere with each other. If so, the interfering RF signals are placed into different groups of combinations of RF signals.

By forming groups of combinations of RF bands, the different RF tests require fewer ports to feed the RF chamber. A total number of the different groups is less than or equal to a total number of ports configured to feed the different groups of RF bands to the interior of the RF testing chamber. Hence, combining RF bands allows for performing tests with a number of RF signals that is greater than the total number of available ports to the RF chamber. Moreover, numerous sources of RF signals can be fed to the RF chamber without needing to reconfigure connections to the ports of the RF chamber to perform different tests.

In 506, the test system can perform the different RF tests by routing the RF bands to the ports of the RF testing chamber such that RF bands for the different tests use common ports of the RF testing chamber. In one example, the different RF tests are performed by simultaneously routing the RF bands for the different tests to the ports of the RF chamber. In another example, the different RF tests are performed by routing RF bands for the different tests to the ports of the RF chamber at different points in time. In yet another example, the different RF tests are performed independent of each other. In one example, a first combination can include RF bands for performing both of the different tests and a second combination can include RF bands for performing only one of the different tests. Examples of the different tests can involve 2G, 3G, 4G, 5G, or E911 technologies.

In one example, the method 500 is performed at least in part by a combiner device disposed in-line between one or more distinct sources of the RF bands and the RF chamber (as shown in FIG. 6). The combiner is part of a testing system that can include components such as the RF chamber, sources of RF signals, etc. For example, the combiner device can receive the RF signals from different RF sources. The combiner device can be configured to input the RF bands and route the RF bands to form the combinations of RF bands output by the combiner device to the ports of the RF chamber.

In some embodiments, the method 500 is performed algorithmically to dynamically formulate the combinations of RF bands based on the total number of RF bands, frequencies of the RF bands, the total number of ports of the RF testing chamber, etc. For example, one or more memories can be configured to store instructions for determining the combinations of the RF signals based on the number of ports of the RF chamber and the RF signals. Further, one or more processors can be configured to execute the instructions thereby causing the system to generate a map for connecting the one or more sources of the RF signals to ports of the combiner device and routing the RF signals through the combiner device to output the combinations of the RF signals. The combiner device can operate automatically to formulate routing pathways to combine the RF signals in groups where each group is connected to a single port of the RF chamber.

In some embodiments, the combiner device includes the one or more memories and the one or more processors. In some embodiments, the one or more memories and the one or more processors are included in another computing device communicatively coupled to the combiner device. Hence, the combiner can be programmed remotely by another computing device. The combiner device is reconfigurable based on the instructions executed by the one or more processors to route combinations of RF signals to the ports of the RF chamber. For example, the combiner device can be configurable to route all the RF signals simultaneously to the ports of the RF chamber. Thus, the computing device can be configurable based on instructions to dynamically generate combinations of RF bands for the ports of the RF chamber.

The selection of a combination of frequency bands for any port can be performed algorithmically by the combiner device. For example, the process can include receiving as inputs the total number of ports available for possible combinations of frequency bands. The algorithm further receives as inputs the different frequency bands of the different radios from the different radio sources. The process then performs an optimization to identify a combination of two or more non-interfering frequency bands that can be connected to the same port. In some embodiments, the output of the process is a mapping between ports of an RF chamber and the pipes of RF sources.

Figure 7:
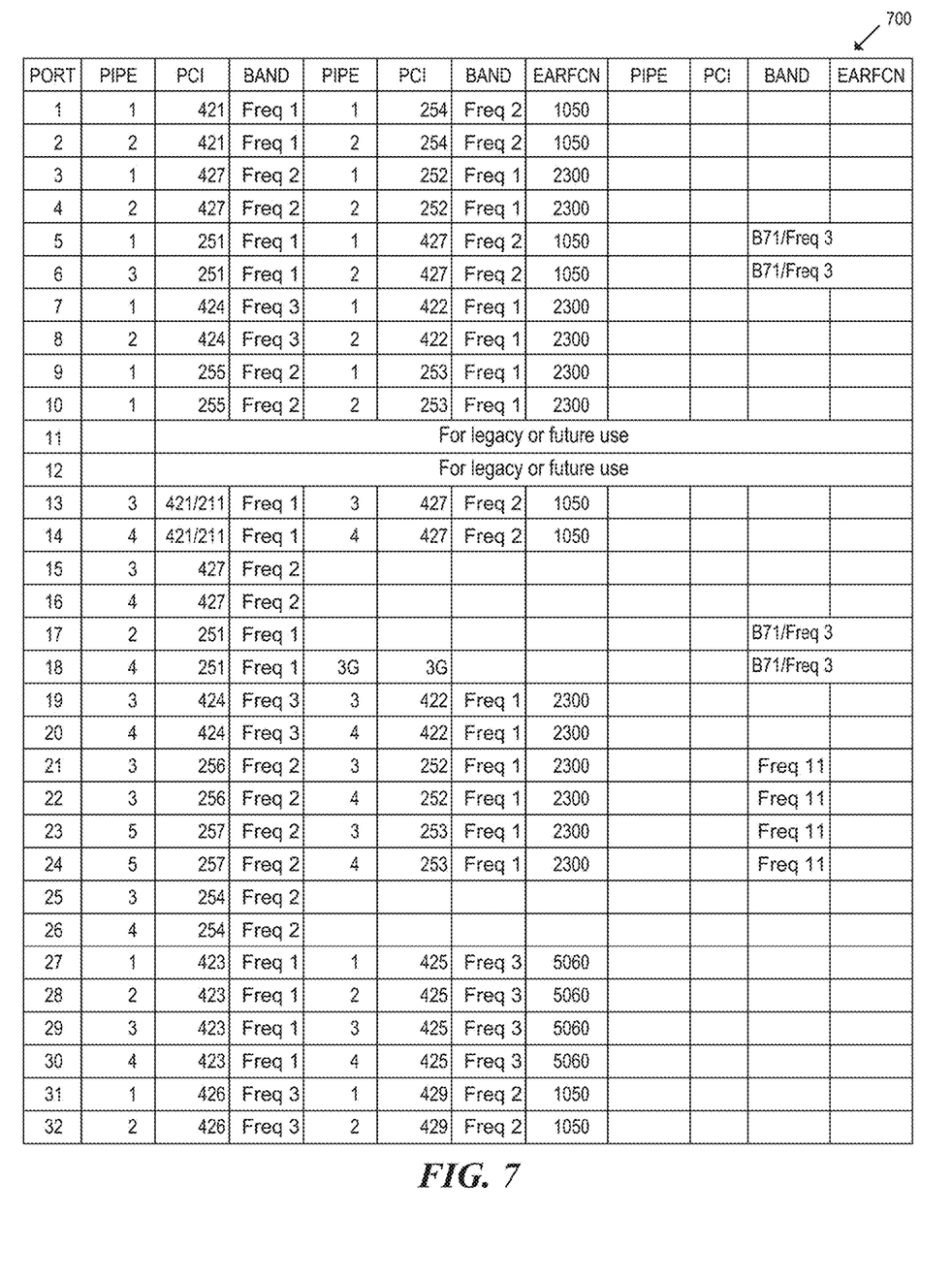
FIG. 7 is a table that illustrates a routing map for combining non-interfering RF bands into groups that feed common ports of an RF chamber.

For example, FIG. 7 is a table that illustrates a routing map for combining non-interfering RF bands into groups that feed common ports of an RF chamber. The routing map 700 implements the aforementioned algorithm to combine only non-interfering RF signals into groups that feed common ports of an RF chamber to perform different RF tests. As shown in the routing map 700, there are only 32 ports available for the RF chamber. PC's feed the ports through pipes. That is, a PCI can have distinct RF signals communicated via pipes to distinct ports. Lastly, each RF signal is associated with a frequency band of "Freq 1," "Freq 2," "Freq 3," or "Freq 4." In addition, the routing map 700 optionally has a frequency channel number (E-UTRA absolute radio frequency channel number (EARFCN)) that, in LTE, designates the carrier frequency in the uplink and downlink.

In the illustrated example, each PCI (421, 254, 252, 427, etc.) is associated with up to four pipes. For example, PCI 421 has pipes 1, 2, 3, and 4 that provide RF signals at Freq 1. As such, these RF signals must be fed to different ports to avoid interference. In this example, pipes 1, 2, 3, and 4 of PCI 421 feed ports 1, 2, 13, and 14, respectively. Similarly, pipes 1, 2, 3, and 4 of PCI 254 feed ports 1, 2, 15, and 26, respectively, that each provide an RF signal at Freq 2. Given that Freq 1 and Freq 2 would not interfere with each other, the routing map 700 combines some of the pipes of PCI 421 and PCI 254 into groups that feed the same ports. In particular, pipes 1 and 2 feed RF signals from both PCI 421 and PCI 254.

The routing map 700 in this example combines up to three non-interfering RF bands for the same port. However, the embodiments are not limited to this number of RF bands that could be combined for any particular port. The routing map 700 also shows that some ports remain unused. In other examples, a routing map is optimized to use a minimal number of available ports or limits a maximum number of RF non-interfering RF bands for any groups. A person skilled in the art would understand different combinations and constraints of the disclosed techniques that could optimize the routing map in different ways.

Thus, rather than needing a technician to perform re-cabling of pipes for different radios of different RF sources, a combiner device can route RF signals into combinations for common ports of an RF chamber such that multiple RF tests can be performed without needing to re-cable the ports for new RF sources.

Figure 8:
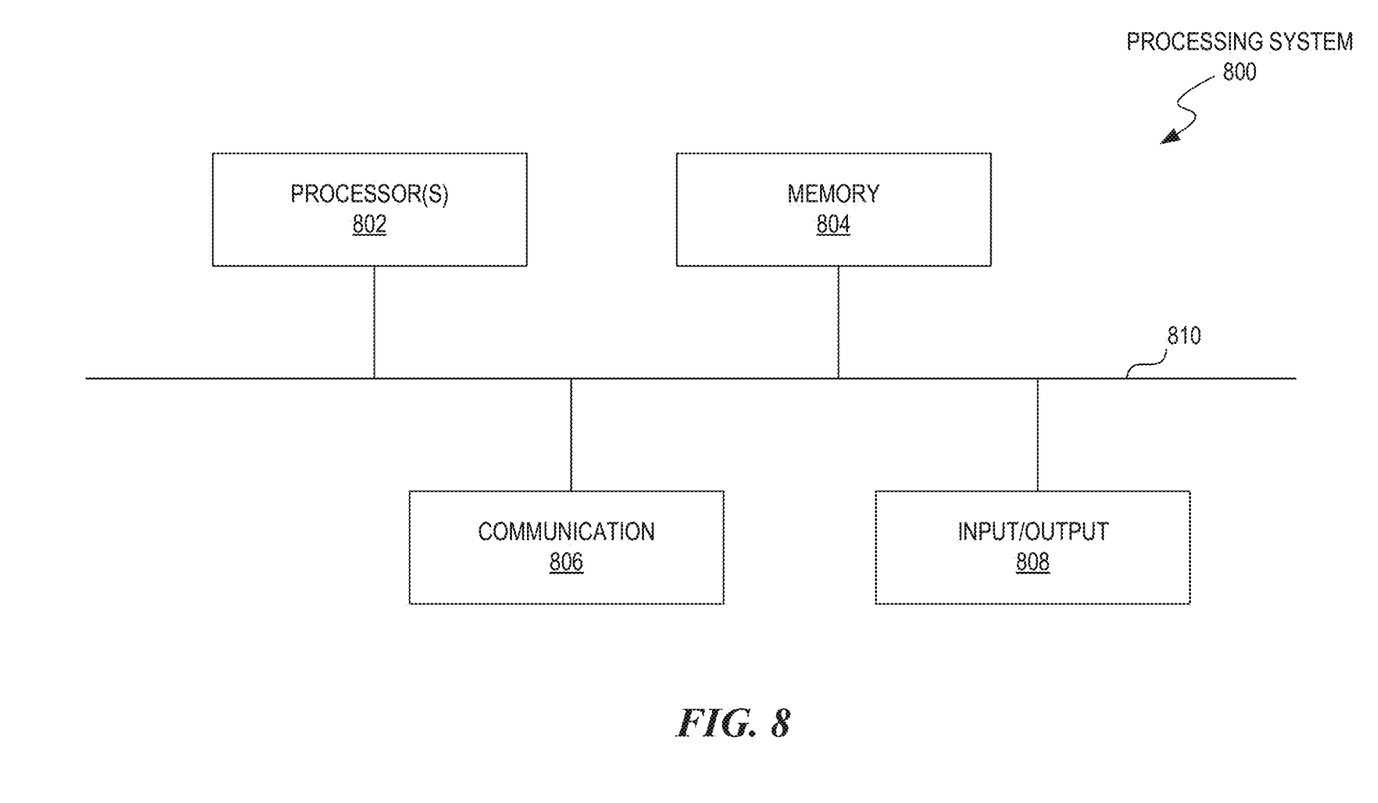
FIG. 8 is a block diagram that illustrates an example processing system in which aspects of the disclosed technology can be embodied.

FIG. 8 is a block diagram illustrating an example of a processing system 800 in which at least some operations described herein can be implemented. The processing system 800 represents a system that can run any of the methods/algorithms described herein. For example, any network access device (e.g., user device) component of a network can include or be part of a processing system 800. The processing system 800 can include one or more processing devices, which can be coupled to each other via a network or multiple networks. A network can be referred to as a communication network or telecommunications network.

In the illustrated embodiment, the processing system 800 includes one or more processors 802, memory 804, a communication device 806, and one or more input/output (I/O) devices 808, all coupled to each other through an interconnect 810. The interconnect 810 can be or include one or more conductive traces, buses, point-to-point connections, controllers, adapters and/or other conventional connection devices. Each of the processor(s) 802 can be or include, for example, one or more general-purpose programmable microprocessors or microprocessor cores, microcontrollers, application specific integrated circuits (ASICs), programmable gate arrays, or the like, or a combination of such devices.

The processor(s) 802 control the overall operation of the processing system 800. Memory 804 can be or include one or more a physical storage facilities, which can be in the form of random-access memory (RAM), read-only memory (ROM) (which can be erasable and programmable), flash memory, miniature hard disk drive, or other suitable type of storage device, or a combination of such devices. Memory 804 can store data and instructions that configure the processor(s) 802 to execute operations in accordance with the techniques described above. The communication device 806 can be or include, for example, an Ethernet adapter, cable modem, Wi-Fi adapter, cellular transceiver, Bluetooth transceiver, or the like, or a combination thereof. Depending on the specific nature and purpose of the processing system 800, the I/O devices 808 can include devices such as a display (which can be a touch screen display), audio speaker, keyboard, mouse or other pointing device, microphone, camera, etc.

While processes or blocks are presented in a given order, alternative embodiments can perform routines having steps or employ systems having blocks, in a different order, and some processes or blocks can be deleted, moved, added, subdivided, combined and/or modified to provide alternative or sub-combinations, or can be replicated (e.g., performed multiple times). Each of these processes or blocks can be implemented in a variety of different ways. In addition, while processes or blocks are at times shown as being performed in series, these processes or blocks may instead be performed in parallel, or can be performed at different times. When a process or step is "based on" a value or a computation, the process or step should be interpreted as based at least on that value or that computation.

Software or firmware to implement the techniques introduced here can be stored on a machine-readable storage medium and can be executed by one or more general-purpose or special-purpose programmable microprocessors. A "machine-readable medium", as the term is used herein, includes any mechanism that can store information in a form accessible by a machine (a machine can be, for example, a computer, network device, cellular phone, personal digital assistant (PDA), manufacturing tool, any device with one or more processors, etc.). For example, a machine-accessible medium includes recordable/non-recordable media (e.g., read-only memory (ROM), random-access memory (RAM), magnetic disk storage media, optical storage media, flash memory devices), etc.

Note that any and all of the embodiments described above can be combined with each other, except to the extent that it may be stated otherwise above, or to the extent that any such embodiments might be mutually exclusive in function and/or structure. Although the present invention has been described with reference to specific exemplary embodiments, it will be recognized that the invention is not limited to the embodiments described but can be practiced with modification and alteration within the spirit and scope of the disclosed embodiments. Accordingly, the specification and drawings are to be regarded in an illustrative sense rather than a restrictive sense.

Physical and functional components (e.g., devices, engines, modules, and data repositories) associated with processing system 800 can be implemented as circuitry, firmware, software, other executable instructions, or any combination thereof. For example, the functional components can be implemented in the form of special-purpose circuitry, in the form of one or more appropriately programmed processors, a single board chip, a field programmable gate array, a general-purpose computing device configured by executable instructions, a virtual machine configured by executable instructions, a cloud computing environment configured by executable instructions, or any combination thereof. For example, the functional components described can be implemented as instructions on a tangible storage memory capable of being executed by a processor or other integrated circuit chip. The tangible storage memory can be computer-readable data storage. The tangible storage memory can be volatile or non-volatile memory. In some embodiments, the volatile memory can be considered "non-transitory" in the sense that it is not a transitory signal. Memory space and storage described in the figures can be implemented with the tangible storage memory as well, including volatile or non-volatile memory.

Each of the functional components can operate individually and independently of other functional components. Some or all of the functional components can be executed on the same host device or on separate devices. The separate devices can be coupled through one or more communication channels (e.g., wireless or wired channel) to coordinate their operations. Some or all of the functional components can be combined as one component. A single functional component can be divided into sub-components, each sub-component performing separate method steps or a method step of the single component.

In some embodiments, at least some of the functional components share access to a memory space. For example, one functional component can access data accessed by or transformed by another functional component. The functional components can be considered "coupled" to one another if they share a physical connection or a virtual connection, directly or indirectly, allowing data accessed or modified by one functional component to be accessed in another functional component. In some embodiments, at least some of the functional components can be upgraded or modified remotely (e.g., by reconfiguring executable instructions that implement a portion of the functional components). Other arrays, systems and devices described above can include additional, fewer, or different functional components for various applications.

Aspects of the disclosed embodiments can be described in terms of algorithms and symbolic representations of operations on data bits stored in memory. These algorithmic descriptions and symbolic representations generally include a sequence of operations leading to a desired result. The operations require physical manipulations of physical quantities. Usually, though not necessarily, these quantities take the form of electric or magnetic signals that are capable of being stored, transferred, combined, compared, and otherwise manipulated. Customarily, and for convenience, these signals are referred to as bits, values, elements, symbols, characters, terms, numbers, or the like. These and similar terms are associated with physical quantities and are merely convenient labels applied to these quantities.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number can also include the plural or singular number respectively. The word "or," in reference to a set of two or more items, covers all of the following interpretations of the word: any of the items in the list, all of the items in the list, and any combination of the items in the list.

The above detailed description of embodiments of the system is not intended to be exhaustive or to limit the system to the precise form disclosed above. While specific embodiments of, and examples for, the system are described above for illustrative purposes, various equivalent modifications are possible within the scope of the system, as those skilled in the relevant art will recognize. For example, some network elements are described herein as performing certain functions. Those functions could be performed by other elements in the same or differing networks, which could reduce the number of network elements. Alternatively or additionally, network elements performing those functions could be replaced by two or more elements to perform portions of those functions. In addition, while processes, message/data flows, or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes, message/data flows, or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges. Those skilled in the art will also appreciate that the actual implementation of a database can take a variety of forms, and the term "database" is used herein in the generic sense to refer to any data structure that allows data to be stored and accessed, such as tables, linked lists, arrays, etc.

The teachings of the methods and system provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the technology can be modified, if necessary, to employ the systems, functions, and concepts of the various references described above to provide yet further embodiments of the technology.

These and other changes can be made to the invention in light of the above Detailed Description. While the above description describes certain embodiments of the technology, and describes the best mode contemplated, no matter how detailed the above appears in text, the invention can be practiced in many ways. Details of the system may vary considerably in its implementation details, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the technology are presented below in certain claim forms, the inventors contemplate the various aspects of the technology in any number of claim forms. For example, while only one aspect of the invention is recited as embodied in a computer-readable medium, other aspects can likewise be embodied in a computer-readable medium. Accordingly, the inventors reserve the right to add additional claims after filing the application to pursue such additional claim forms for other aspects of the technology.

I claim:

1. A system for testing a wireless device with radio frequency (RF) signals, the system comprising:
   an RF chamber with ports configured to receive RF signals for an interior of the RF chamber;
   a combiner device with ports configured to receive the RF signals from one or more sources and route combinations of the RF signals to the ports of the RF chamber,
   wherein the RF signals include interfering RF signals and non-interfering RF signals,
   wherein a total number of the ports of the RF chamber is less than a total number of the RF signals; and
   wherein a total number of the combinations of the RF signals is less than the total number of RF signals;
   one or more memories configured to store instructions for combining the RF signals based on the number of ports of the RF chamber and the RF signals; and
   one or more processors configured to execute the instructions thereby causing the system to route the RF signals through the combiner device and output the combinations of the RF signals to the ports of the RF chamber.

2. The system of claim 1, wherein the combinations of RF signals are RF signals for testing different RF tests.

3. The system of claim 1, wherein the combiner device includes the one or more memories and the one or more processors.

4. The system of claim 1, wherein the total number of the ports of the RF chamber is less than a total number of ports of the combiner device that receives the RF signals from the one or more sources.

5. The system of claim 1, wherein execution of the instructions by the processor cause the system to generate a map for connecting the one or more sources of the RF signals to ports of the combiner device.

6. The system of claim 1, wherein the combiner device is reconfigurable based on the instructions executed by the one or more processors to route combinations of RF signals to the ports of the RF chamber.

7. The system of claim 1, wherein the combiner device is configurable to route all the RF signals simultaneously to the ports of the RF chamber.

8. A method for enabling a radio frequency (RF) testing chamber to perform different RF tests, the method comprising:
- determining a total number of RF bands required to perform the different RF tests;
- combining the total number of RF bands into different groups of RF bands,
  - wherein each RF band of any group is distinct from any other RF band of any other group,
  - wherein each group only includes a combination of RF bands that are non-interfering among the group, and
  - wherein a total number of the different groups is less than or equal to a total number of ports configured to feed the different groups of RF bands to an interior of the RF testing chamber; and
- performing the different RF tests by routing the RF bands to the ports of the RF testing chamber such that RF bands for the different tests use common ports of the RF testing chamber.

9. The method of claim 8, wherein the different RF tests are performed by simultaneously routing the RF bands for the different tests to the ports of the RF chamber.

10. The method of claim 8, wherein the different RF tests are performed by routing the RF bands for the different tests to the ports of the RF chamber at different points in time.

11. The method of claim 8, wherein the different RF tests include a first RF test and a second RF test performed independent of the first RF test.

12. The method of claim 8, wherein the method is performed by a combiner device disposed in-line between one or more sources of the RF bands and the RF testing chamber.

13. The method of claim 8, wherein the method is performed by a combiner device configured to input the RF bands and route the RF bands to form the groups of RF bands output by the combiner device to the ports of the RF chamber.

14. The method of claim 8, wherein each combination of RF bands is determined algorithmically based on the total number of RF bands, frequencies of the RF bands, and the total number of ports of the RF testing chamber.

15. The method of claim 8, wherein a first combination of RF bands includes first RF bands for performing both of the different tests and a second combination of the RF bands includes second RF bands for performing only one of the different tests.

16. The method of claim 8, wherein the different RF tests include two or more of a 2G, 3G, 4G, 5G, or E911 tests.

17. The method of claim 8, wherein the total number of the ports of the RF testing chamber is less than a total number of ports required to perform one of the RF tests.

18. At least one non-transitory computer-readable storage medium carrying instructions that, when executed by a computing device, cause the computing device to perform operations for enabling a radio frequency (RF) testing chamber to perform RF tests, the operations comprising:
- determining a total number of RF bands required to perform a number of RF tests, wherein the RF bands include non-interfering RF bands and interfering RF bands;
- combining the total number of RF bands into multiple combinations of the RF bands,
  - wherein each combination only includes RF bands that are non-interfering among the combination, and
  - wherein a total number of the multiple combinations of RF bands is less than or equal to a total number of ports of RF testing chamber configured to feed the RF bands to an interior of the RF testing chamber; and
- testing a wireless device contained in the RF testing chamber by simultaneously routing the RF signals to the interior of the RF testing chamber via the ports of the RF testing chamber.

19. The computer-readable storage medium of claim 18, wherein the computing device is configurable based on instructions to dynamically generate combinations of RF bands for the ports of the RF testing chamber.

20. The computer-readable storage medium of claim 18, wherein the RF bands are provided by multiple distinct sources of the RF signals.

* * * * *